United States Patent [19]

Erb

[11] Patent Number: 4,745,454
[45] Date of Patent: May 17, 1988

[54] HIGH CAPACITY SEMICONDUCTOR CAPACITANCE DEVICE STRUCTURE

[75] Inventor: Darrell M. Erb, Los Altos, Calif.

[73] Assignee: Advanced Micro Devices, Inc., Sunnyvale, Calif.

[21] Appl. No.: 926,600

[22] Filed: Nov. 3, 1986

Related U.S. Application Data

[63] Continuation of Ser. No. 689,199, Jan. 7, 1985, abandoned.

[51] Int. Cl.$^4$ .................... H01L 29/92; H01L 29/78; H01L 27/02
[52] U.S. Cl. ....................................... 357/51; 357/14; 357/23.6
[58] Field of Search ........................... 357/14, 23.6, 51

[56] References Cited

U.S. PATENT DOCUMENTS 4,350,536 9/1982 Nakano et al. .................... 357/23.6
4,413,401 11/1983 Klein et al. ....................... 357/23.6

OTHER PUBLICATIONS

Sodini et al., *Enhanced Capacitor for One-Transistor Memory Cell*, IEEE Transactions on Electron Devices, vol. 23, pp. 1187-1189, Oct. 1976.
Tasch et al., *The Hi-C Ram Cell Concept*, IEEE Transactions on Electron Devices, 33-41, vol. 25, No. 1, Jan. 1978.

*Primary Examiner*—Martin H. Edlow
*Assistant Examiner*—D. Featherstone
*Attorney, Agent, or Firm*—Patrick T. King; J. Vincent Tortolano; Gary Aka

[57] ABSTRACT

The present invention provides for a method for manufacturing a charge storage region in a semiconductor substrate for a memory cell in a dynamic RAM, comprising forming an insulating layer on the substrate, forming a masking layer over the insulating layer, forming at least one aperture in the masking layer, the aperture defining the charge storage region in the semiconductor substrate, implanting dopant ions of a first polarity through the aperture for diffusion through the substrate, and implanting dopant ions of a second polarity through the aperture for diffusion through the substrate to a lesser degree than the first polarity dopant diffusion so that the diffusion of the first polarity dopant with respect to the diffusion of the second polarity dopant forms a P-N junction substantially aligned with the edge of the masking layer aperture to define the periphery of the charge storage region. One way of diffusing the second polarity dopant to a lesser degree than the first polarity dopant in the substrate is to select a first polarity dopant which has a diffusivity greater than the second polarity dopant. Another way of achieving the desired diffusion of first polarity dopant with respect to the second polarity dopant is to select the two dopants with diffusivities approximately equal and to diffuse the first polarity dopant before the second polarity dopants is implanted into the semiconductor substrate.

11 Claims, 3 Drawing Sheets

HIGH CAPACITY SEMICONDUCTOR CAPACITANCE DEVICE STRUCTURE

This application is a continuation of application Ser. No. 689,199, filed 1-7-85 now abandoned.

BACKGROUND OF THE INVENTION

This invention relates to the field of integrated circuit devices and, more particularly, a method of manufacturing highly packed memory cell capacitance devices for highly integrated dynamic RAMs and the resulting structure.

Present day dynamic random access memory (RAM) devices have many thousands of individual memory cells, each comprising a transistor and a capacitor. The capacitor can hold one bit of information by being in a changed state or an uncharged state; the transistor acts as a switch to electrically connect the capacitor to the rest of the RAM device so that information may be read from the capacitor or written into the capacitor.

Ideally, a memory cell capacitor should have a large capacitance per unit area. This permits the capacitor to be physically small so as to densely packed to permit a very high degree of integration in a semiconductor substrate without requiring an increased sensitivity of the sense amplifier which would read the amount of charge stored on the capacitor. Efforts to achieve a high capacitance per unit area memory cell has resulted in the so-called "Hi-C" RAM memory cell disclosed by C. G. Sodini and T. I. Kamins in their paper, "Enchanced Capacitor for One-Transistor Memory Cell," IEEE Trans. Electron Devices, Vol. ED-23, pp. 1187-1189, October 1976 and further expanded by A. F. Tasch, et al., "The Hi-C Ram Cell Concept," IEEE Trans. Electron Devices, Vol. ED-25, No. 1, pp. 33-41, January 1978.

This concept involves the implantation of an impurity layer of one polarity above a second impurity layer of another polarity in a semiconductor substrate. A capacitor oxide layer is formed on the substrate and a conductive layer is laid on top of the oxide layer to form the capacitance device. This structure has an enhanced capacitance because there are two components of capacitance. The first is the oxide capacitance, the capacitance between the conducting layer over the gate oxide and the substrate below; the second is the depletion layer capacitance, which is formed by the juxtaposition of the two implanted dopant layers of opposing polarities. This structure contrasts with the standard structure of a dynamic RAM cell capacitor which has only the oxide capacitance. The new structure has a much greater capacitance per unit area.

The present invention is a method of manufacturing Hi-C memory cell capacitance device by which such capacitors may be packed together to the greatest extent possible for a particular processing technology and the resulting device structure therefrom. With the present invention, each of the capacitor devices is cearly defined with respect to another device so that each capacitor remains electrically isolated from others to retain its electrical integrity. Savings in semiconductor substrate space is achieved and the integration of the entire RAM device is enhanced.

SUMMARY OF THE INVENTION

One embodiment of the present invention is a method for manufacturing a charge storage region in a semiconductor substrate comprising forming an insulating layer on the substrate, forming a masking layer over the insulating layer, forming at least one aperture in the masking layer, the aperture defining the charge storage region in the semiconductor substrate, implanting dopant ions of a first polarity through the aperture for diffusion through the substrate, and implanting dopant ions of a second polarity through the aperture for diffusion through the substrate to a lesser degree than the first polarity dopant diffusion so that the diffusion of the first polarity dopant with respect to the diffusion of the second polarity dopant forms a P-N junction substantially aligned with the edge of the masking layer aperture to define the periphery of the charge storage region.

One way of diffusing the second polarity dopant to a lesser degree than the first polarity dopant in the substrate is to select a first polarity dopant which has a diffusivity greater than the second polarity dopant. Examples of such first and second polarity dopants are boron and arsenic, respectively.

Another way of achieving the desired diffusion of first polarity dopant with respect to the second polarity dopant is to select the two dopants with diffisivities approximately equal and to diffuse the first polarity dopant before the second polarity dopants is implanted into the semiconductor substrate. First and second polarity dopants having nearly equal diffusivities are boron and phosphorus respectively.

Still another way of a plurality of these charge storage regions in a semiconductor substrate comprises forming a first insulating layer on the substrate, forming a first masking layer on the first insulating layer, forming an aperture in the first masking layer to define a first region on the substrate, implanting ions of a first polarity dopant through the aperture to a predetermined concentration in the substrate, removing the first masking layer, forming a second masking layer on the first insulating layer forming a plurality of apertures in the second masking layer, each of the apertures disposed substantially over the first region, and implanting ions of a second polarity dopant through the apertures to a predetermined concentration in said substrate so that the concentration of the second polarity dopant with respect to the concentration of the first dopant forms a P-N junction substantially aligned with the edge of each second masking layer aperture to define the periphery of a charge storage region.

The various methods of manufacture result in a semiconductor device structure having a plurality of adjoining capacitance devices comprising a plurality of regions defining charge storage regions and having dopants of a second polarity at the surface of a semiconductor substrate and extending into the substrate, a plurality of regions having dopants of a first polarity, the same as that of the substrate bulk, at the surface and extending into the substrate and disposed between the second polarity dopant regions so as to form P-N junctions at the interface between the first and second polarity dopant regions to electrically isolate the second polarity dopant regions from each other, an insulating layer over the first and second polarity regions, the thickness of the insulating layer over the first polarity regions being less than 1,000 Angstroms, and a conducting layer over the insulating layer, whereby the conducting layer, the charge storage regions and portions of the insulating layer above the charge storage regions form the capacitance devices.

BRIEF DESCRIPTION OF THE DRAWINGS

A more detailed understanding may be obtained by reference to the detailed description of the invention below and the following drawings.

DETAILED DESCRIPTION

Figure 1:
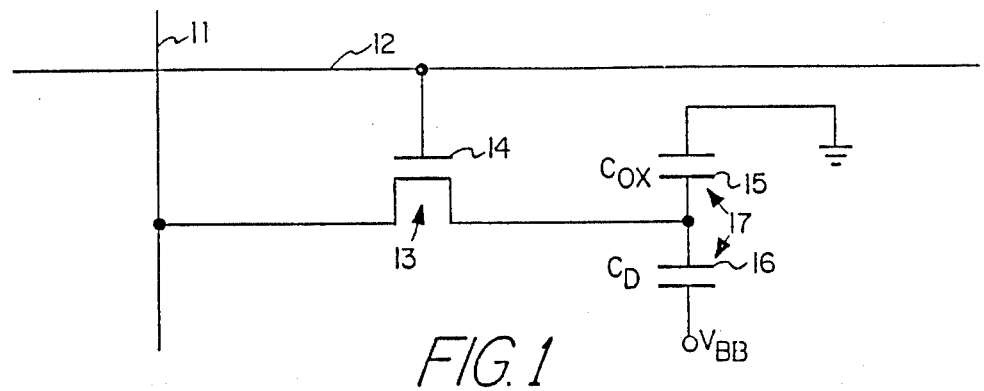
FIG. 1 is a circuit schematic of a Hi-C memory cell.

FIG. 1 shows the circuit schematic of a Hi-C memory cell. The memory cell has an access transistor 13 which has one terminal connected to a bit line 11 and the other terminal connected to a charge storage capacitor 17 having two components, an oxide capacitance and a depletion layer capacitance. In FIG. 1, the oxide capacitance is represented by a separate capacitor 15 and the depletion layer capacitance is represented by a capacitor 16. One plate of the capacitor 15 is at ground and another plate of the depletion layer capacitor 16 is at the voltage $V_{BB}$, the back gate, or substrate, bias generated in the bulk of the semiconductor substrate. The gate 14 of the transistor 13 is connected to a word line 12. A signal on the word line 12 turns on the transistor 13 so that the content of the storage capacitor is electrically accessible to the bit line 11.

Figure 2A:
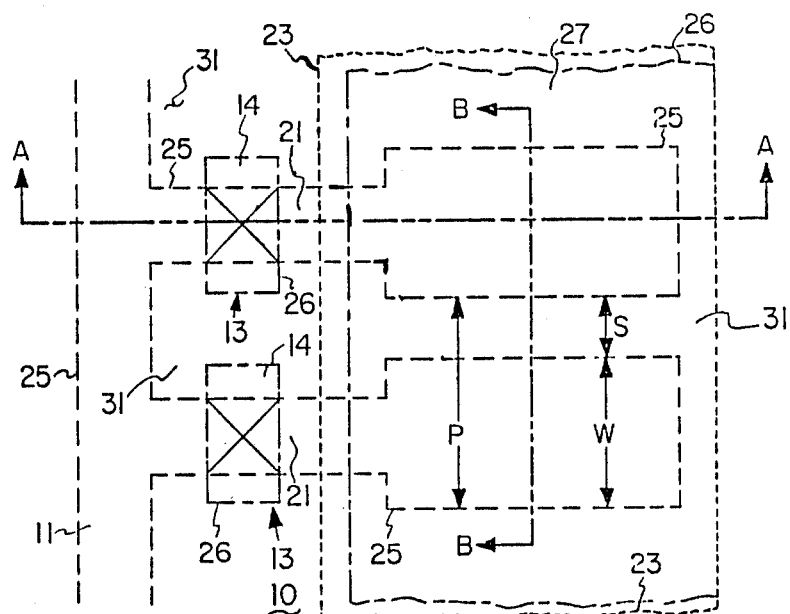
FIG. 2A is a view of the conventional physical layout of the Hi-C memory cell on a semiconductor substrate.

FIG. 2A is a plan view of a pair of adjoining memory cells, each of which corresponds to the circuit schematic shown in FIG. 1, on a lightly P-doped silicon substrate 10. This pair represents the thousands of memory cells in one RAM device. The dotted and dashed lines show some of the various masks used to form the memory cells on the substrate by a conventional process, which uses a source/drain mask outlined by the dashed line 25 to isolate each memory cell from the others. The dotted line 23 indicates the capacitor mask which covers the parts at the substrate outside the capacitor regions while the double implant of P- and N-type dopants is performed. A polysilicon mask is demarcated by the dashed line 26, which defines the field plate 27 for the capacitors 17 and the gate electrodes 14 for the access transistors 13 of each memory cell. A physical word line, which is represented by the line 12 in FIG. 1 for each of the memory cells of FIG. 2A runs perpendicular to the bit line 11 over an insulating layer of silicon dioxide over the polysilicon layer as defined by the mask outlined by the dashed line 26. Each word line contacts the gate electrode 14 of each access transistor 13 at the indicated "X" mark through an aperture in the insulating layer. Neither the word line nor the insulating layer of silicon dioxide is shown.

Figure 2B:
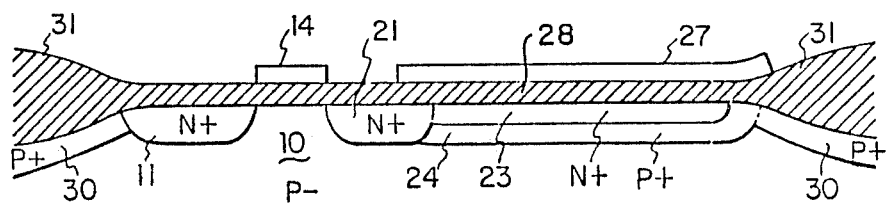
FIG. 2B is a cross-sectional view of the memory cell of FIG. 2A along line A—A.

A sectional view of one of the memory cells in FIG. 2A along a line A—A is illustrated in FIG. 2B. The substrate 20 is covered by a field oxide layer 31 in the field regions of the substrate 10, i.e., those regions outside the active regions of the substrate 10, as defined by the source/drain mask indicated by the dotted line 25. Under the field oxide layer 31 is a field implant 30 of a P-type dopant which prevents parasitic channeling between active regions of the substrate 10. The bit line 11 is a heavily doped region with donor (N+) impurities. The bit line 11 also forms part of each access transistor 13 which has the polysilicon gate 14 and the other source/drain region 21, also an N+ region. The capacitor for each memory cell is formed by a charge storage region in the substrate with a first implant layer 24 of acceptor impurities (P+) and a second impant layer 23 of N+ impurities. The boundary of these two regions becomes depleted to create a depletion capacitance contribution to the charge storage structure. In FIG. 1 this contribution was noted as $C_D$. Over these charge storage regions, which are outlined by the layer 23 in a plan view, in the substrate there is a gate oxide layer 28 and over that is a polysilicon layer 27 which forms the field plate of the capacitor. The polysilicon layer 27 separated by the oxide layer 28 from the N+ layer 23 contributes the oxide capacitance to the capacitor 16. In FIG. 1 this contribution is denoted as $C_{OX}$.

Figure 3A:
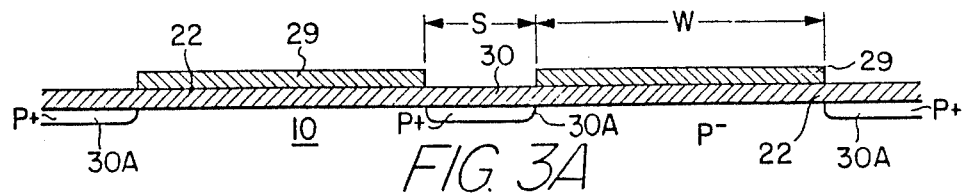
FIGS. 3A, 3B and 3C are conventional process steps used to manufacture the Hi-C capacitor device. The views shown are cross-sectional along line B—B of FIG. 2A.
Figure 3B:
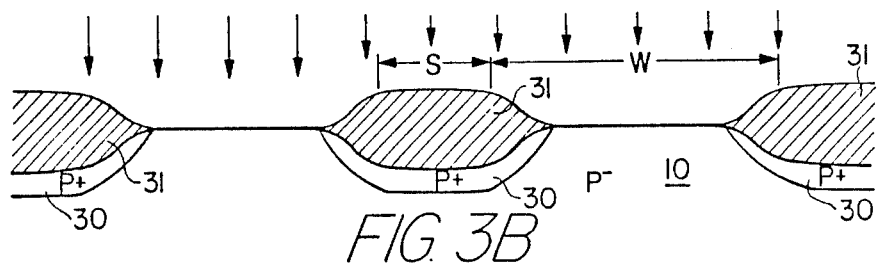
Figure 3C:
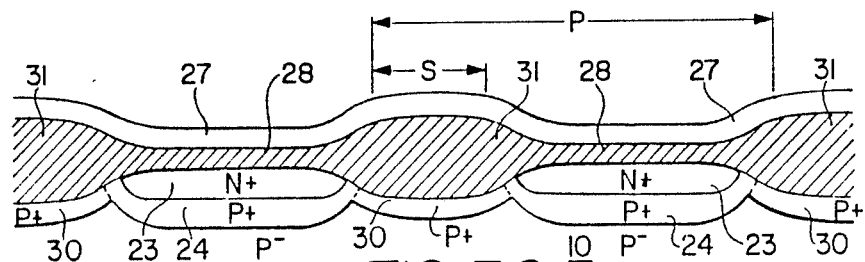

FIGS. 3A, 3B and 3C show part of the conventional process technique use in forming the pair of capacitor devices. The three drawings are a sectional view of FIG. 2A along line B—B.

The conventional process uses the insulating field oxide layer as a mask to form the double implanted charge storage regions with N+ layer 23 and P+ layer 24 while the capacitor mask indicated by the dotted line 23 blocks the implants outside these regions.

The field oxide 31 is formed from the initial barrier silicon dioxide layer 22 of a few hundred Angstroms thickness over the substrate 10. A silicon nitride layer 29 by well-known photolithographic techniques is defined on the barrier oxide layer 22 by the source/drain mask demarcated by the dotted line 25 in FIG. 2A. However, the photolithographic mask of photoresist material is also used for the field implant into the substrate regions 30A, before the photoresist is removed. The substrate is then heated in an oxidizing atmosphere so that the portions of layer 22 left exposed by the nitride layer 29 grow to an appropriate field oxide thickness, approximately 10,000 Angstroms with the initial implant regions 30A developing into the field impant regions 30 located below. Since the portions of the barrier oxide layer 22 under the nitride layer 29 are masked, these portions do not grow. After oxidation, the nitride layer 29 and the thin barrier oxide layer 22 are removed. FIG. 3B illustrates the state of the substrate at this stage.

It should be noted that the drawings herein are representational only and do not preserve true scale; a comparison of the thicknesses of the field oxide 31 in FIG. 3B and the barrier oxide layer 22 in FIG. 3A illustrates this point.

The downward pointing arrows in FIG. 3B indicate the double implant of P and N-type dopants with the masking field oxide 31 and the capacitor mask of photoresist defined by the line 23 in FIG. 2A. FIG. 3C shows the completed capacitors each having the charge storage region with P+ and N+ layers, 23 and 24 respectively, and the field implant regions 30 in the substrate 10. A capacitor oxide 28 has been regrown over charge storage regions and the polysilicon field plate 27 deposited over the now completely insulated substrate 10.

A closer examination of FIGS. 2A, 3A, 3B and 3C reveals some of the shortcomings of conventional processing. With a given photolithographic process, there is a maximum resolution attainable. For present day projection alignment techniques using light, the maximum resolution of the photomasks for the photoresist material appears to be about 2 microns. The conventional process above requires that the photoresist cover the nitride layer 29 over the charge storage regions in order to define the nitride mask for the field oxidation step. With 2 microns being used to define the separation between the capacitors for the photomask, it has been found that inevitably more than the photolithographically defined amount of photoresist is removed yielding actual separation distances between photoresist material of 2 to 2.5 microns.

Additionally, the underlying nitride layer 29 exposed between the charge storage regions must be etched. This further increases the separation distances since more than just the exposed nitride layer 29 will be removed by undercutting into the nitride under the photoresist. This is a natural consequence of an etching step.

Thus, the actual seperation S as shown in FIG. 3A is larger than the defined spearation of 2 microns imposed by the limits of the particular photolithographic technique of projection alignment.

A further disadvantage of the conventional process is apparent. With each capacitor having a width W, the nitride layer 29 is formed with the separation S and the masking nitride layer 29 of width W to define the charge storage region of each capacitor. After the thick field oxide 31 is formed, it can be seen that as the field oxide 31 tapers in thickness, it encroaches into the capacitor oxide layer 28 over the charge storage region in the substrate 10. This would seem inevitable in a structure which has more than a 10 to 1 ratio of oxide thickness just outside the charge storage region to that of the gate oxide. As a rule of thumb, this encroachment by the field oxide 31 into the gate oxide 28 is about the field oxide thickness. This thickening at the edges of each capacitor reduces the total capacitance of each device. With the dimensions given above and assuming a typical capacitor width W of 6 microns, the actual width is reduced to 4 microns. A corresponding severe reduction in capacitance occurs. To compensate for this loss the capacitors width W may be increased. However, such an increase lengthens the pitch P, the sum of the width W and the separation S, of the capacitors. Each capacitor is widened to occupy more space, which reduces the packing density of the memory cell. Likewise, an alternative increase in the length of each capacitor has the same undesirable result. Since the memory cell is duplicated many thousands of times in a present day RAMs, this compensation has an immediate adverse impact on the packing density and chip size of the RAM device.

The present invention, on the other hand, takes full advantage of a particular photolithographic technology.

Figure 4:
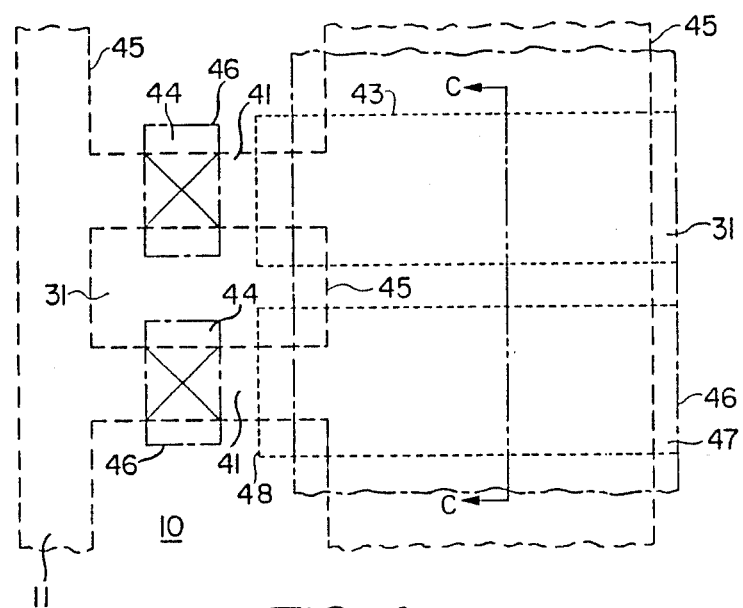
FIG. 4 is a view of the Hi-C memory cell according to the present invention.

The various photolithographic masks of this invention are outlined in FIG. 4. The present invention starts with a lightly doped acceptor concentration of approximately $5 \times 10^{14}/cm^3$ in the silicon substrate 10 and a barrier oxide layer 42 grown over the substrate in the range of a few hundred to nearly a thousand Angstroms thick, 500 Angstroms being an optimum thickness. A silicon nitride layer is deposited to a thickness of about 1,000 Angstroms over this silicon dioxide. Then portions of the nitride layer are removed to form the source/drain mask which is outlined by the dashed line 45. With a silicon nitride layer over the active regions of the substrate a field implant of acceptor impurity ions is made into the field regions of the substrate as was explained previously. Subsequently, using the silicon nitride as a mask the exposed barrier oxide layer is grown to a thickness of approximately of 10,000 Angstroms to form the field oxide 31. At this point it should be noted that the field oxide does not appear between the adjacent charge storage regions to any significant extent. The source/drain mask demarcated by the line 45 in FIG. 4 is different from the source/drain mask in FIG. 2A.

The remaining nitride and barrier oxide layers under the nitride layer are removed by simple etching techniques. Subsequently, a second oxide layer 52 is grown over the exposed active region of the substrate 10 to a thickness in the range of a 100 to 300 Angstroms, 200 Angstroms being an optimum. A capacitor mask of photoresist material 49 which delineates the charge storage regions, at least partially, and outlined by the dotted line 43 is formed. Through the apertures defined by the photoresist material 49 and the thick field oxide 31, the regions bounded by the dotted and dashed lines 43 and 45, the ion implant of boron into the substrate 10 is performed to create a preliminary implant layer 53A. This is followed by an implant of arsenic to create a preliminary layer 54A. The dose of boron (P+) is $10^{13}$ions/cm$^2$ at 100 KeV in the substrate 10 and the dose of arsenic (N+) is $10^{14}$ions/cm$^2$ at 100 KeV. The exposed parts of thin oxide layer 52 are then removed by etching and the photoresist 49 stripped off. What remains is the exposed surface of the substrate enclosed by the dotted line 43 and the oxide layer 52 of approximately 200 Angstroms thick between adjacent charge storage regions. By an oxidation step, the exposed substrate 10 has the oxide layer regrown over it to a thickness of 300 to 500 Angstroms, the capacitor oxide region 58, while the region 51 between the change storage regions is thickened to 450 to 650 Angstroms. It has been found that a capacitor oxide thickness of 400 Anstroms and a thickness of 550 Angstroms for the oxide not covering the charge storage regions are very effective oxide layer dimensions. Thus, an oxide thickness ratio of less than 2 to 1 is created as compared to the structure of the conventional process. In fact, by stripping off the photoresist 49 off first, removing the thin oxide layer 52 completely and then regroving the oxide layer over the substrate 10, the capacitor oxide regions 52 and the separating oxide regions 51 can have the same thickness, a ratio of 1 to 1. Such a structure is also effective. What is common to the above process and its variation is that the thickness of the oxide regions 51 is much less than the typical field oxide of 10,000 Angstroms and, in fact in devices soon to be in production, less than 1,000 Angstroms. Certain integrated circuit devices currently under development employ oxide regions of less than 500 Angstroms. The advantage of this is discussed below.

With the substrate oxidized, a polysilicon layer is dispositoed over the substrate for a thickness of approximately 3,000 Angstroms and with the polysilicon mask, the same as that in FIG. 2A, as indicated by the dashed line 46, the field plate is formed over the charge storage regions. The same polysilicon layer also forms the gate electrode 44 over the access transistors.

Following the formation of the capacitor field plate 47 and the access transistor gate electrodes 44, a source/drain implant of arsenic is performed to dope these portions of the polysilicon layer and to form the N+ source and drain regions of the access transistors and the bit line 11.

Finally, the substrate is placed in a oxidizing atmosphere and a "drive-in" step at temperatures above 1000° C. is performed. A typical set of parameters for such a step is 1030° C. for 70 minutes. One of the effects of this step is that the implant of impurities of arsenic and boron diffuse differentially through the substrate 10. With the large difference in diffusivities of boron and arsenic, e.g., boron has a diffusivity of approximately $2 \times 10^{-14}$ cm$^2$/sec arsenic $1 \times 10^{-15}$ cm$^2$/sec at 1000° C., a P-N junction is formed substantially below the edge of the masking photoresist layer which define the charge storage regions with respect to each other.

Figure 5A:
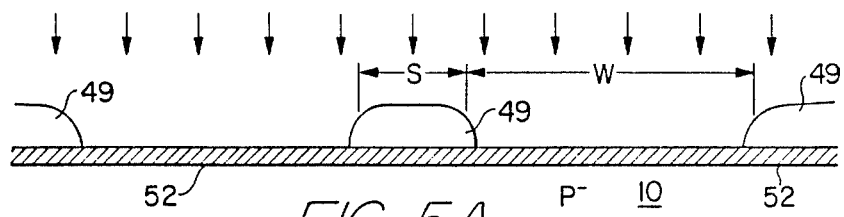
FIGS. 5A, 5B and 5C are the manufacturing steps according to the present invention. The views shown are cross sectional along line C—C of FIG. 4.
Figure 5B:
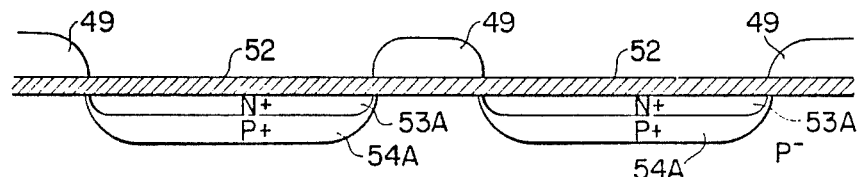
Figure 5C:
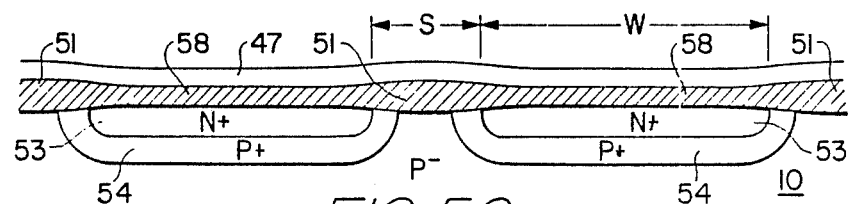

FIGS. 5A, 5B and 5C illustrate this point. The drawings are a cross-sectinal view along line C—C of FIG. 4. FIG. 5A shows the substrate 10 with capacitor mask of photoresist material 49 on the thin oxide layer 52 to define the charge storage regions of each Hi-C memory cell. Using the same design dimensions as the conventional process, each aperture defined by the masking layer 49 is of width W and separates adjoining charge storage region by the amount S.

Through each aperture boron and arsenic ions are implanted. FIG. 5B illustrates this stage in the process. While the two preliminary dopant regions 53A and 54A are shown as separate layers, the implant energies of the two impurities may be set so as to intermingle the boron and arsenic impurities.

The photoresist layer 49 is retained as a mask and the exposed portions of the thin oxide layer 52 over the charge storage regions are removed. Then the photoresist layer 49 is stripped away, and another oxidizing step is performed to regrow the capacitor oxide 58 and thicken the oxide layer 51 between the charge storage regions. FIG. 5C illustrates this structure, which also has the covering polysilicon field plate layer 47 to complete each capacitor structure.

FIG. 5C further illustrates that after the drive-in step, the P-type dopants of boron have diffused much more extensively than the N-type arsenic. The diffused boron layer 54 has expanded a good deal from the original implanted layer 54A. In contrast, the diffused arsenic layer 53 has remained comparatively immobile. Thus, the boron diffuses ahead of the arsenic to effectively isolate the N+ layer 53 from the adjoining charge storage regions. The P-N junction formed by the arsenic layers 53 and the boron layer 54 at the surface of the substrate 10 is substantially below periphery of the capacitor mask aperture.

It should be noted that in the process above the photoresist layer 49 is left over the regions of the substrate 10 separating the capacitors in contrast to the conventional process. The excess removal of photoresist material beyond that defined by the photomask now favors the novel process above. With the same photolithographic constraints of 2 microns resolution, it has been found that photoresist layer 49 for separating the charge storage regions varies from 1.5 to 2 microns so that capacitor areas may actually increase.

Furthermore, no nitride layer is used in the present isolation method and nitride undercutting in the conventional process is avoided.

Finally, no encroachment of the capacitor oxide occurs, which is due to the lack of thickness of the oxide regions 51, as compared to the conventional process and structure. Since the capacitor oxide layer 58 is still thin at these peripheral regions a capacitor of width W is formed. No compensation by widening the capacitor is required to maintain the capacitance of each memory cell.

Figure 6:
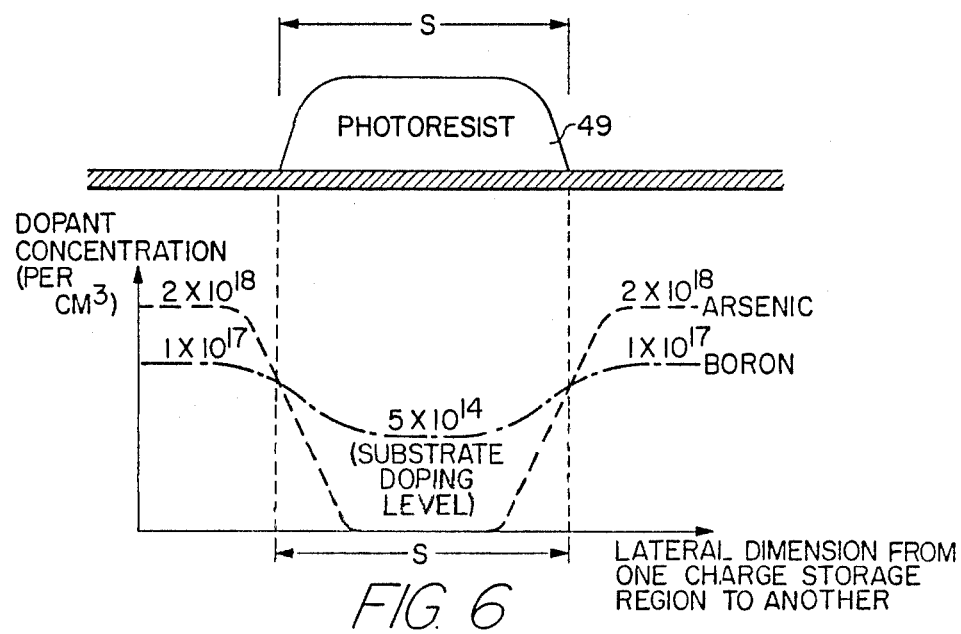
FIG. 6 illustrates the concentrations of two implanted dopants with respect to a masking layer and shows how the charged storage region is defined in a semiconductor substrate according to the present invention.

A closer examination of the differential diffusion is shown in FIG. 6, which has a portion of the photoresist mask layer 49 used to define two adjoining charge storage regions illustrated above and the corresponding lateral dopant profiles for the implanted boron and arsenic near the surface of the substrate after diffusion. Note however, the dopant profiles are drawn to illustrate how charge storage region isolation is achieved and not to show the exact doping profiles, which may be calculated from the well-known error function lateral diffusion behavior of a dopant from a mask edge in a semiconductor substrate.

Before diffusion, all of the dopants implanted remain in the charge storage regions, i.e., those regions in the substrate not covered by the layer 49. After diffusion, the more mobile boron moves laterally into regions between the two charge storage regions as compared to the arsenic dopants. The two doping profiles cross below and substantially aligned with the edges of the layer 49 showing the switch in overall concentrations from one polarity type dopant to another polarity type dopant, i.e., a P-N junction. Thus, the regions at and near the surface of the substrate between the charge storage regions are P-doped and the charge storage regions N-doped. The exact location of the junction may not be below the edge of the layer 49 exactly, depending upon processing variations, but the junction remains very much closer to the photoresist edges than, say, the ends of the field oxide encroaching into the capacitor oxide from the edge of the nitride layer 29 defining the charge storage region by the conventional process.

The resulting capacitor-to-capacitor isolation structure consists of two back-to-back n+—p+ diodes with an overlying grounded capacitor field plate which is separated from the diodes by a relatively thin oxide layer. This isolation structure can be thought of as a MOS transistor with the field plate being the gate. As with conventional MOS transistors, the new isolation structure exhibits a threshold voltage defined by the field plate voltage above which a capacitor-to-capacitor current would flow for a given capacitor-to-capacitor bias, e.g., 5 V. For the device described herein, the threshold voltage is in the range of 1.5 to 2.0 V. For this reason the new isolation structure requires that the field plate be grounded to isolate each capacitor from each other.

Likewise, as with conventional MOSFETS, the threshold voltage increases with increasing amounts of p-type dopant in the channel, i.e., the region between the charge storage regions. Therefore, higher threshold voltage isolation structures can be obtained by implanting a larger amount of p+ dopant into the region 54A of FIG. 5B. This will also cause an increase of the depletion capacitance portion of the storage capacitance. However, for larger p+ dopant concentrations, the n+—p+ diode avalanche breakdown voltage is reduced. For a memory chip which operates with typical design margins, such as a maximum power supply voltage of +7 V and a maximum substrate back bias of −4 V, the n+ −p+ diode must withstand 7 V+4 V, or 11 volts. The structure with the particular dopant concentrations described herein is optimized to use the highest p+ implant dose and to have an avalanche breakdown larger than 11 volts.

An alternative of implanting dopants of nearly equal diffusivities is also available. For example, once the capacitor mask is formed by the photoresist layer 49, the boron can be implanted into the charge storage regions as before. A diffusion, or driven-in, step is performed so that the lateral doping profile of boron is like that in FIG. 6. Then, a N-type dopant, such as phosphorous, having nearly the same diffusivity as boron is diffused through the same aperture. A diffusion step for the phosphorous is also performed, but the boron, having already laterally diffused into the regions between the charge storage regions, effectively isolates the N+ layer 53 of each capacitor.

Still another embodiment of the invention which possesses the advantages of the new isolation scheme consists of implanting only the n+ dopant through the mask aperture described by the line 43 of FIG. 4. The p+ dopant, e.g., boron, is implanted using an additional mask having an aperture with the same outline as the field plate delineated by the dashed line 46. Basically this mask permits the p+ dopant to be introduced into the charge storage regions and the regions between the charge storage regions but blocks the dopant from other areas. Because the boron is intentionally implanted into the isolation regions between the charge storage region at the expense of an additional masking step, this embodiment does not depend on the lateral diffusion of the p+ dopant into the region between the capacitors. This isolation structure has the charge storage advantages of the isolation scheme where both P and N-type dopants are implanted through the same mask and offers superior isolation characteristics because of the greater amount of boron in the isolation regions. The higher boron concentration will result in a larger threshold voltage for the n+ −p+ −n+ MOSFET formed by neighboring N+ regions and the capacitor field plate, as explained previously.

These alternative embodiments retain the feature of the relatively thin oxide layer regions 51 between the gate oxide layer regions 58 so as to avoid encroachment of the field oxide into the capacitor oxide regions, a disadvantage of the conventional process. Moreover, other advantages of the present invention described previous are still applicable to these embodiments.

Accordingly, while the invention has been particularly shown and described with reference to the preferred embodiments, it would be understood by those skilled in the art that changes in form and details may be made therein without departing from the spirit of the invention. It is therefore intended that an exclusive right be granted to the invention as limited only by the metes and bounds of the appended claims.

What is claimed is:

1. A semiconductor device structure for providing a plurality of capacitance devices comprising:
   (a) a semiconductor substrate having an upper surface;
   (b) a plurality of first regions of a first conductivity type provided within said substrate, said first regions being disposed at the upper surface of said substrate;
   (c) a plurality of second regions of a second conductivity type provided within said substrate, said second regions being disposed at the upper surface of said substrate such that a portion of each of said second regions is interposed between a respective one of said first regions and the remainder of said substrate;
   (d) an insulating layer overlying the upper surface of said substrate including said first and second regions, the thickness of said insulating layer overlying the portions of said substrate between said second regions at the upper surface of said substrate being less than about 1,000 Angstroms, wherein the thickness of said insulating layer over said first regions at the upper surface of said substrate is in the range of about 300 to 500 Angstroms and the thickness of said insulating layer overlying the portions of said substrate between said second regions at the upper surface of said substrate is in the range of about 450 to 650 Angstroms; and
   (e) a conducting layer overlying said insulating layer, whereby the application of a ground reference voltage potential to said conducting layer provides for the electrical isolation of said respective first regions.

2. The structure of claim 1, wherein the respective concentrations of dopants in said first and second regions are sufficient to resist a reverse breakdown potential in excess of 11 volts.

3. The structure of claim 2 wherein said first and second regions are doped with arsenic and boron, respectively.

4. The structure of claim 3 wherein said semiconductor substrate, said insulating layer and said conducting layer respectively comprise silicon, silicon dioxide and polysilicon.

5. A semiconductor device structure for providing a plurality of capacitor devices comprising:
   (a) a semiconductor substrate having an upper surface;
   (b) a plurality of first regions of a first conductivity type provided within said substrate, said first regions being disposed at the upper surface of said substrate;
   (c) a plurality of second regions of a second conductivity type provided within said substrate, said second regions being disposed at the upper surface of said substrate such that a portion of each of said second regions is interposed between a respective one of said first regions and the remainder of said substrate;
   (d) an insulating layer overlying the upper surface of said substrate, said insulating layer having a thickness in the range of about 300 to 500 Angstroms overlying said first regions at the upper surface of said substrate and in the range of about 450 to 650 Angstroms overlying the portions of said substrate between said second regions at the upper surface of said substrate; and
   (e) a conducting layer overlying said insulating layer, whereby the application of a reference voltage potential to said conducting layer will provide for the electrical isolation of said respective first regions.

6. The structure of claim 5 wherein the respective concentrations of dopants in said first and second regions are sufficient to resist a reverse breakdown potential in excess of 11 volts.

7. The structure of claim 6 wherein said first and second regions are doped with arsenic and boron respectively.

8. The structure of claim 7 wherein said semiconductor substrate, said insulating layer and said conducting layer respectively comprise silicon, silicon dioxide and polysilicon.

9. A semiconductor apparatus for operation with respect to a ground reference voltage potential, said apparatus comprising:
   (a) a substrate of a first conductivity type and background doping density, said substrate having a first surface;
   (b) a plurality of first regions of a second conductivity type provided adjacent said first surface and extending into said substrate;
   (c) a plurality of second regions respectively encompassing said first regions within said substrate, said second regions being of said first conductivity type and having a doping density greater than the background doping density of said substrate;
   (d) a layer of insulating material overlying said first surface including said pluralities of said first and second regions, said layer having a thickness of about 300 to about 650 Angstroms and varying in thickness by a ratio of less than about 2 to 1; and
   (e) a layer of conductive material overlying said insulating material layer and adapted for receiving said ground reference voltage so as to provide for the mutual electrical isolation of neighboring ones of said first regions.

10. The apparatus of claim 9 wherein the doping densities of said first and second regions are sufficient to provide for a reverse breakdown potential in excess of 11 volts.

11. The apparatus of claim 10 wherein said first regions are doped to a N-type conductivity and said substrate and said second regions are doped to a P-type conductivity.

* * * * *